US010288668B2

(12) United States Patent
Roemer et al.

(10) Patent No.: US 10,288,668 B2
(45) Date of Patent: May 14, 2019

(54) MINIATURE ARC FAULT CURRENT SENSOR AND SYSTEMS

(71) Applicant: PULSE ELECTRONICS, INC., San Diego, CA (US)

(72) Inventors: Glenn Roemer, San Diego, CA (US); Fuxue Jin, San Diego, CA (US); Russell Machado, San Diego, CA (US); Bruce Hamilton, Escondido, CA (US)

(73) Assignee: Pulse Electronics, Inc., San Diego, CA (US)

( * ) Notice: Subject to any disclaimer, the term of this patent is extended or adjusted under 35 U.S.C. 154(b) by 618 days.

(21) Appl. No.: 15/040,390

(22) Filed: Feb. 10, 2016

(65) Prior Publication Data

US 2016/0231375 A1 Aug. 11, 2016

Related U.S. Application Data

(60) Provisional application No. 62/115,078, filed on Feb. 11, 2015.

(51) Int. Cl.
*G01R 31/02* (2006.01)
*G01R 31/12* (2006.01)
*G01R 31/14* (2006.01)
*H02H 1/00* (2006.01)

(52) U.S. Cl.
CPC ....... *G01R 31/1272* (2013.01); *G01R 31/025* (2013.01); *G01R 31/14* (2013.01); *H02H 1/0015* (2013.01)

(58) Field of Classification Search
CPC .. G01R 31/1272; G01R 31/025; G01R 31/14; H02H 1/0015

USPC .......... 324/537, 500, 750.01, 521, 552, 600, 324/519, 617, 622, 683, 709, 66, 750.17, 324/754.28, 548, 658, 661, 76.66
See application file for complete search history.

(56) References Cited

U.S. PATENT DOCUMENTS

| 4,841,235 A | 6/1989 | Hastings et al. |
|---|---|---|
| 5,946,179 A | 8/1999 | Fleege et al. |
| 6,232,857 B1 | 5/2001 | Mason, Jr. et al. |
| 6,377,427 B1 | 4/2002 | Haun et al. |
| 6,608,741 B1 | 8/2003 | MacBeth |

(Continued)

FOREIGN PATENT DOCUMENTS

WO WO-9835237 A2 8/1998

*Primary Examiner* — Melissa J Koval
*Assistant Examiner* — Trung Nguyen
(74) *Attorney, Agent, or Firm* — Gazdzinski & Associates, PC

(57) ABSTRACT

An arc fault sensor disposed on a circuit board proximate to a current carrying trace. The arc fault sensor includes a magnetic flux concentrator (MFC). The MFC includes a first flange and a second flange that are joined by a center post. Each of the first and second flanges have a cross sectional area that is larger than the center post. A sense coil winding is wound around the center post. The arc fault sensor generates an output voltage that is proportional to a rate of change of current in the current carrying conductor. For a given diameter of the sense coil winding, the output voltage is enhanced by the ratio of the cross-sectional areas of the flanges relative to the cross-sectional area of the center post. Methods of manufacturing and utilizing the aforementioned arc fault sensor are also disclosed.

17 Claims, 11 Drawing Sheets

(56) References Cited

U.S. PATENT DOCUMENTS

| | | |
|---|---|---|
| 6,995,315 B2 | 2/2006 | Sharma et al. |
| 8,259,986 B2 | 9/2012 | Danovi et al. |
| 2004/0008022 A1 | 1/2004 | Viola et al. |
| 2005/0073293 A1 | 4/2005 | Hastings et al. |
| 2005/0156587 A1* | 7/2005 | Yakymyshyn ....... G01R 15/207 324/117 R |
| 2012/0279320 A1 | 11/2012 | Coscoy et al. |
| 2013/0154397 A1* | 6/2013 | Sullivan ................. H02K 21/00 310/12.18 |
| 2014/0253108 A1 | 9/2014 | Singh et al. |

* cited by examiner

MINIATURE ARC FAULT CURRENT SENSOR AND SYSTEMS

PRIORITY

This application claims priority to and co-owned U.S. Provisional Patent Application Ser. No. 62/115,078 filed Feb. 11, 2015 entitled "Miniature Arc Fault Current Sensor", which is incorporated herein by reference in its entirety.

COPYRIGHT

A portion of the disclosure of this patent document contains material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

BACKGROUND

1. Technological Field

The present disclosure relates generally to circuit elements and more particularly to devices for the sensing of arc fault currents, and methods of utilizing and manufacturing the same.

2. Background of the Invention

An arc fault is a high power discharge of electricity between two or more conductors. This discharge generates heat, which can break down the wire's insulation and ignite nearby flammable material thereby causing a fire. Arc faults range from a few amperes to thousands of amperes and generate a detectible broadband electrical signature. This signature can typically range from 100 Hz to 1 GHz depending on the bandwidth of the electrical system in which the arcing occurs.

The danger of arc faults has been recognized since the widespread use of electricity. The U.S. Consumer Product Safety Commission (CPSC) recognized in the latter part of the $20^{th}$ century the majority of the high U.S. fire death rate was caused by residential fires of electric origin. During the 1990's arc fault detection and circuit interruption technology reached commercial feasibility. Underwriters Laboratories (UL) and the National Electrical Manufactures Association (NEMA) recognized the need for, and produced standards for, Arc Fault Circuit Interrupters (AFCIs) similar to overload circuit breakers. The National Electric Code began requiring Arc Fault Circuit Interrupters (AFCIs) in bedroom circuits in 1999. NEC has recently expanded the AFCI requirement to circuits in all living spaces as well as in photovoltaic solar (PV) installations due to the danger from PV DC arc faults. The recent UL Standard 1699, Arc Fault Circuit Interrupters, defines the requirements for UL certification of AFCIs which interrupt a circuit (similar to a circuit breaker) when an arc fault signature is detected in the circuit.

Modern AFCIs are composed of an arc fault sensor component, detector circuitry, and an electrical circuit interruption mechanism. Electrical distribution system AFCIs are typically integrated in circuit breakers and AC plug-ins/receptacles. For PV systems, the AFCIs are integrated in string inverters, DC equalizers, microinverters, and combiner boxes.

To provide electrical isolation between the arc fault current carrying conductor and the AFCI sensor components, most of the arc fault sensors used in AFCI systems are toroidal current transformers (CTs) with a magnetic core or toroidal Rogowski coils (RCs) with no magnetic core packaged inside a toroidal plastic housing. These AFCI sensors present a number of problems:

1) They tend to be large (several centimeters in diameter and a centimeter high), much too large for the thin (e.g., 0.5 inch) circuit breakers, AC receptacles, and PV combiner boxes, microinverters, and DC equalizers.
2) The primary (conductor carrying the arc fault signal to be sensed) must be routed through the center of these AFCI sensor toroids. Such routing limits flexibility, is inconvenient, and expensive.
3) The bandwidth of CTs (<1 MHz), Rogowski Coils (<10 MHz) is much less than the bandwidth of the arc fault signals being sensed which causes them to act like low pass filters and limits the performance of the detection circuits.
4) Arc fault sensor toroids are expensive compared to the miniature arc fault current sensor. In addition to the external plastic toroidal container, CTs require a magnetic core large enough so that it does not saturate with the normal AC and DC currents of the application and hundreds of turns of copper wire. Rogowski coils also require hundreds of turns of precisely wound copper wire and extra electrical amplification for their low signal output.

The increasing application of AFCIs require a sensor component without the above-referenced shortcomings that is small enough to be deployed near or between adjacent traces on a printed circuit board (PCB) while having sufficient output to support arc fault detection circuitry.

SUMMARY

The present disclosure satisfies the aforementioned needs (i.e., addresses the shortcoming of CT and RC toroidal sensors of the prior art) by providing an improved current sensor apparatus and methods for manufacturing and using the same.

In a first aspect, current sensing apparatus are disclosed. In one embodiment, the current sensing apparatus comprises an arc fault sensing component that is sufficiently compact to fit near or between traces on a printed circuit board (PCB) while generating a sufficient signal so as to detect arc fault signals. The primary conductor does not need to be routed through the sensors as with prior art CTs and RCs.

In a second embodiment, a miniature arc fault sensor component is disclosed. The arc fault sensor component has an outer dimension that is less than one centimeter as measured transverse to a trace. The miniature arc fault sensor component is mounted adjacent to an arc fault current carrying trace. The miniature arc fault sensor component has outer dimensions relative to the trace including an outer dimension that is parallel to the trace, an outer dimension that is transverse to the trace, and an outer dimension that is transverse to the plane of the PCB.

In a variant, the miniature arc fault sensor component has outer dimensions that fit within a cube that is one centimeter on a side.

In yet another variant, the PCB trace includes segments that are substantially transverse to each other and adjacent to at least two sides of the miniature arc fault sensor component to enhance a signal generated by the miniature arc fault sensor component.

In yet another variant, the PCB trace is routed around the miniature arc fault sensor component so as to be adjacent to three sides of the miniature arc fault sensor component. The PCB trace can define an open rectangle or "U-shaped" pattern.

In yet another variant, the PCB trace includes segments that are adjacent to two sides of the miniature arc fault sensor component to enhance a signal generated by the miniature arc fault sensor component. The two segments carry current in substantially opposite directions but provide an additive signal due to the so-called "right hand rule."

In a second aspect, a compact arc fault sensor system is disclosed. In one embodiment, the compact arc fault sensory system includes a compact arc fault sensor configured to sense a varying current in a current carrying conductor on a circuit board, the varying current creating a varying magnetic field that circulates around the current carrying conductor.

In a variant, the compact arc fault sensor includes a magnetic flux concentrator formed from a material having a relative permeability of at least 100 having a center post between two flanges including a first flange and a second flange, the compact arc fault sensor configured to be mounted to the circuit board such that a flux from the circulating magnetic field enters the first flange, passes through center post, and exits through the second flange; and a sense coil winding disposed around the center post of the magnetic flux concentrator, the sense coil winding configured to output a voltage that is proportional to the rate of change of the varying current, the magnetic field strength is increased by the flux concentration between the two flanges to enable a compact sense coil winding to increase the output voltage for a given coil size.

In yet another variant, the current carrying conductor has a desired geometry with respect to the compact arc fault sensor. In one embodiment, the desired geometry includes two portions of one or more circuit board traces that each run parallel with one another at least on a first and a second side of the compact arc fault sensor.

In another embodiment, the desired geometry further includes a third portion of the one or more circuit board traces that runs generally perpendicular to the two portions of the one or more circuit board traces.

In yet another embodiment, the desired geometry includes at least a portion of a circuit board trace that is disposed on a first side of the compact arc fault sensor that is opposite from a second side of the compact arc fault sensor in which a plurality of terminals are disposed, the plurality of terminals each being coupled with the sense coil winding.

In yet another variant, the compact arc fault sensor is disposed on a first surface of the circuit board and the current carrying conductor is disposed on a second opposing surface of the circuit board.

In yet another variant, a second compact arc fault sensor is disclosed that is coupled in series with the first compact arc fault sensor on the circuit board via a pair of output traces.

In a third aspect, methods of manufacturing the aforementioned current sensing apparatus are disclosed. In one embodiment, the method includes forming a magnetic flux concentrator from a magnetically permeable material such that the magnetic flux concentrator includes a pair of flanges and a center post, the center post having a cross-sectional area that is smaller than both of the pair of flanges; winding a plurality of turns of a conductive wire around the center post; and terminating a plurality of ends of the conductive wire onto an interface portion of the current sensing apparatus.

In a fourth aspect, methods of utilizing the aforementioned current sensing apparatus are disclosed. In one embodiment, the output of the current sensing apparatus is increased by routing the primary conductor carrying the current to be sensed around the current sensing apparatus on at least two sides thereof.

In a fifth aspect, commercial and/or industrial machinery incorporating the aforementioned current sensing apparatus are disclosed. In one embodiment, the aforementioned current sensing apparatus is utilized within an environment so as to protect against electric motor failures due to, inter alia, current overloads.

In one variant, the electric motor is utilized for conveyor applications.

In another variant, the electric motor is utilized for crusher applications.

In yet another variant, the electric motor is utilized for shredder applications.

In yet another variant, the electric motor is utilized for grinder applications.

In another embodiment, the aforementioned current sensing apparatus is utilized within an environment so as to aid in the detection of conductive wire insulation deterioration/destruction.

In one variant, the detection of conductive wire insulation deterioration/destruction is utilized within an electric heater.

In another variant, the detection of conductive wire insulation deterioration/destruction is utilized in lighting infrastructure environments such as, for example, an airport runway.

In yet another variant, the detection of conductive wire insulation deterioration/destruction is utilized in ultraviolet and/or infrared processing lamps.

BRIEF DESCRIPTION OF THE DRAWINGS

The features and advantages of the disclosure will become more apparent from the detailed description set forth below when taken in conjunction with the drawings, wherein.

DETAILED DESCRIPTION

Figure 1A:
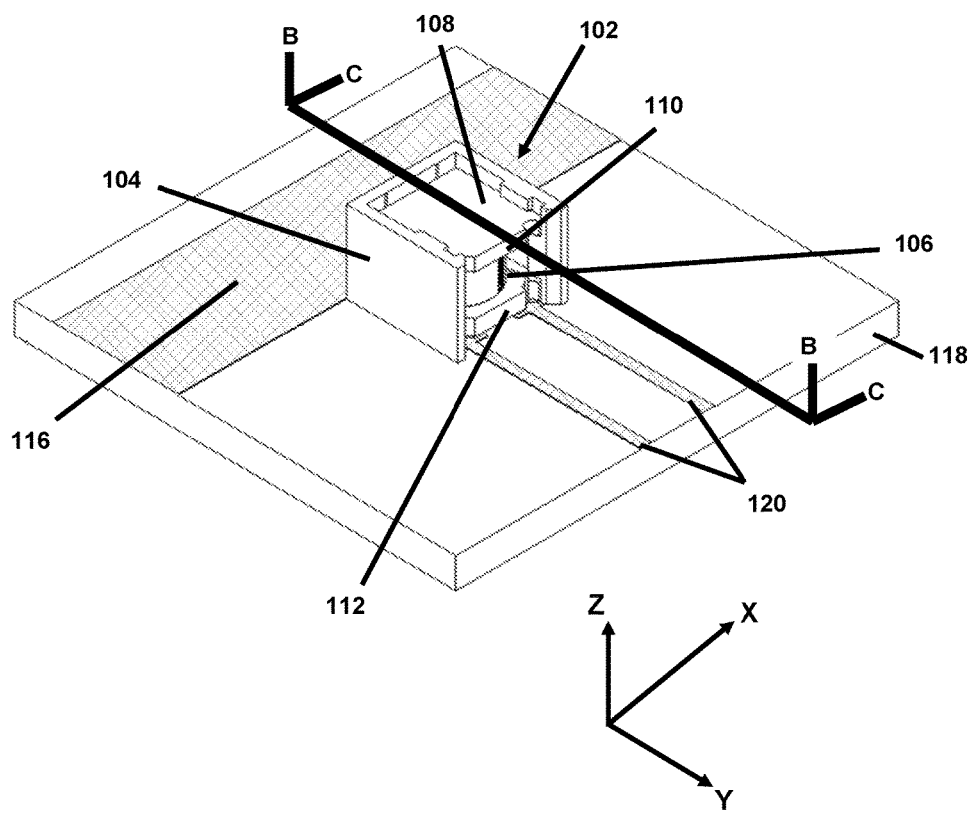
FIG. 1A is a perspective view of one exemplary embodiment of a miniature arc fault current sensor positioned proximate to a current-carrying conductor on a PCB in accordance with the principles of the present disclosure.

Reference is now made to the drawings wherein like numerals refer to like parts throughout.

As used herein, the terms "bus" and "bus bar" are intended to broadly apply to any sensed component(s) (e.g., conductor or plurality of conductors) in an electrical system, regardless of shape or disposition.

As used herein, the terms "bobbin" and "form" (or "former") are used without limitation to refer to any structure or component(s) disposed on or within or as part of an inductive device which helps form or maintain one or more windings of the device.

As used herein, the term "current carrying conductor" is intended to broadly apply to a wide range of conductors including but not limited to, for example, a PCB trace, a metal buss bar, and a wire carrying a current to be sensed.

As used herein, the terms "electrical component" and "electronic component" are used interchangeably and refer to components adapted to provide some electrical and/or signal conditioning function, including without limitation inductive reactors ("choke coils"), transformers, filters, transistors, gapped core toroids, inductors (coupled or otherwise), capacitors, resistors, operational amplifiers, and diodes, whether discrete components or integrated circuits, whether alone or in combination.

As used herein, the term "inductive device" refers to any device using or implementing induction including, without limitation, inductors, transformers, and inductive reactors (or "choke coils").

As used herein, the term "magnetically permeable" refers to any number of materials commonly used for forming inductive cores or similar components, including without limitation various formulations made from ferrite.

As used herein, the term "signal conditioning" or "conditioning" shall be understood to include, but not be limited to, signal voltage transformation, filtering and noise mitigation, signal splitting, impedance control and correction, current limiting, capacitance control, and time delay.

As used herein, the terms "top", "bottom", "side", "up", "down", "upper", "lower" and the like merely connote a relative position or geometry of one component to another, and in no way connote an absolute frame of reference or any required orientation. For example, a "top" portion of a component may actually reside below a "bottom" portion when the component is mounted to another device (e.g., to the underside of a PCB).

Overview

The present disclosure, in an exemplary embodiment, concerns a very compact and high sensitivity current sensing apparatus (or current sensor) that is particularly suitable for use as an arc fault sensor. The compact nature allows this sensor to be placed near or between traces on a relatively small printed circuit (PC) board or flexible circuit. For example, in one embodiment, the sensor can be small enough to fit within a cube having an edge dimension of 1 centimeter (cm). Despite this small size, the sensor is capable of generating a voltage signal of detectable magnitude in response to current changes that are indicative of an arc fault.

In describing this sensor, the PC board will be the primary example. The PC board has a planar surface that extends in lateral directions. The lateral directions can be described as the directions "X" and "Y" which define an "XY" plane that is parallel to the upper surface of the PC board. The PC board includes a current carrying conductor that can be disposed on the upper surface, within the PC board, or on a surface opposing the upper surface. Current passing through the current carrying conductor generates a magnetic field having a strength that is proportional to a current and approximately inversely proportional to a distance from the current carrying conductor.

The sensor is configured to be mounted on the upper surface of the PC board proximate to the current carrying conductor. Variations in the current, such as those produced by an arc fault, generate a varying magnetic flux that passes through the sensor. The sensor generates a voltage across two output terminals that is proportional to the rate of change of the magnetic flux passing through the sensor.

The sensor includes a magnetic flux concentrator (MFC) that is formed from a magnetically permeable material such as soft iron. The MFC includes a first flange, a second flange, and a center post coupling the first flange to the second flange. The first and second flange each have a cross sectional area that is larger than that of the center post. The sensor is mounted to the PC board whereby the magnetic flux passes into the first flange, through the center post, and through the second flange. The MFC concentrates the flux as it passes through the center post.

The sensor also includes a sense coil winding that is wrapped around the center post and is terminated to two terminals. The sense coil winding has N wire turns. Because the sense coil winding is wrapped around the center post, essentially all of the magnetic flux that enters the first flange also passes through all of the turns of the sense coil winding. Thus, a relatively compact coil winding surrounds the magnetic flux that passes into the relatively large area flanges.

As a result of this geometry, a voltage generated at the terminals is essentially proportional to the number of turns N (in the winding) times the rate change of magnetic flux entering and exiting each of the flanges. This allows a relatively small sensor to generate a relatively large voltage for a given current variation in the current carrying conductor. Stated another way, the output voltage of the sense coil winding is enhanced by ratio of the cross sectional area of each flange relative to the cross sectional area of the center post.

In an exemplary embodiment, the MFC is oriented such that the second flange is a lower flange that is mounted proximate to the upper surface of the PCB. Thus the lower flange, center post, and upper flange are arranged along a Z direction that is normal to the XY plane. An edge of the lower flange is proximate to the current carrying conductor. Other embodiments will be described in the following description.

DETAILED DESCRIPTION OF EXEMPLARY EMBODIMENTS

Detailed descriptions of the various embodiments and variants of the apparatus and methods of the disclosure are now provided. While primarily discussed in the context of arc fault current sensing devices, the various apparatus and methodologies discussed herein are not so limited. In fact, the various apparatus and methodologies described herein have usefulness in other current sensing applications such as, for example, the measurement of current entering a commercial/industrial/residential premises.

In addition, it is further appreciated that certain features discussed with respect to specific embodiments can, in many instances, be readily adapted for use in one or more other contemplated embodiments that are described herein (as well as those set forth in incorporated references). It would also be readily appreciated by one of ordinary skill given the present disclosure that many of the features described herein possess broader usefulness outside of the specific examples and implementations with which they are described.

Exemplary Current Sensing Apparatus—

FIGS. 1-6 depict an arc fault sensor 102 according to various embodiments of the present disclosure. Axes X, Y, and Z are mutually orthogonal. Axes X and Y lie in a plane that is parallel to a planar upper surface of a circuit board 118 upon which the arc fault sensor is mounted. In one embodiment, the circuit board 118 is a substantially rigid and planar printed circuit board (PCB) 118 and therefore the XY plane corresponds to an upper surface of the PCB. In other embodiments the circuit board 118 is a flexible circuit board and the XY plane can intersect one or more points of the upper surface of the circuit board 118. From here forward the PCB 118 embodiment will be discussed but it is understood that some embodiments of sensor 102 can be utilized with a flexible board. Directions along the X and Y axes will be referred to herein as "lateral" or "horizontal" directions although it is to be understood that these directions are relative to the circuit board 118 upper surface and not to a gravitational reference. The axis Z is perpendicular to the XY plane and is directed perpendicular to the upper surface of PCB 118.

Referring now to FIG. 1A, a miniature arc fault current sensor 102 mounted on a printed circuit board 118 (PCB) in accordance with the principles of the present disclosure is illustrated. In the illustrated embodiment, the miniature arc fault current sensor includes a sense coil winding 106 wound about a magnetic core 108 that acts as a magnetic flux concentrator (MFC). The magnetic flux concentrator 108 has an upper flange 110 and a lower flange 112 connected by a center post 114 there between. Flanges 110 and 112 and center post 114 are formed from a low reluctance magnetic material. The properties of the magnetic material used for the MFC is a parameter of the device that is discussed in the Device Parameters section in the present disclosure.

The miniature arc fault current sensor 102 is, in the illustrated embodiment, disposed adjacent to a current carrying conductor 116 located on a surface of the PCB. The current carrying conductor runs generally along the X-axis such that the conductor runs parallel with, and in close proximity to, one side of housing 104. While the current carrying conductor is illustrated as being resident on an upper surface of the PCB (i.e., the surface to which the current sensor is mounted), it is appreciated that in alternative embodiments, the current carrying conductor could also be resident within the PCB or alternatively on the bottom surface of the PCB (i.e., the opposite surface to which the current sensor is mounted).

The magnetic field generated by current passing through conductor 116 in the X-direction is strongest at points proximate to the conductor, with the strength of the magnetic field being approximately inversely proportional to the distance from the edge of the conductor. Thus, with respect to the placement of MFC 108, the lower flange 110 is preferably placed as close to the current-carrying conductor 116 as possible, but not overlapping the conductor. For example, assuming current carrying conductor 116 carries current along the +X direction, it will generate a magnetic field that circulates about conductor 116 according to the so-called "right-hand rule". The circulation of the magnetic field can be described as being directed along lines of equal field strength that are approximately axially centered upon the conductor. The strength of the field is approximately proportional to the inverse of the distance from the edge of the conductor 116. Accordingly, from the perspective of FIG. 1B, the magnetic field is directed clockwise around conductor 116 and through MFC 108.

The presence of MFC 108 will focus the field lines as the magnetic field will tend to be drawn into the magnetic material because of its low reluctance. The fact that the flanges of the MFC are placed in close proximity to the conductor assures that a maximum amount of the magnetic flux will enter the MFC via the upper flange 110 and exit the MFC via lower flange 112. Hence, between the upper and lower flanges, the flux is concentrated and passes through center post 114 of the MFC, thereby providing a maximized magnetic field strength through sense coil winding 106.

It should be noted that if the miniature arc fault current sensor component 102 is placed over the current carrying trace 116 or overlapping the edge of the current carrying trace 116, it will operate as described above, but the output will be less than if the placement were immediately adjacent to the trace 116 because that portion of the current in trace 116 that is under the component will generate magnetic field lines that oppose those from current in the trace not under the component thereby reducing the net magnetic field through the MFC and the resultant output of the miniature arc fault current sensor.

The shape of the MFC flanges 110 and 112, is an important parameter of the component, affects amount of flux concentrated, and hence the output produced by the miniature arc fault current sensor. This shape parameter the component is discussed in the Device Parameters section of the present disclosure.

In the illustrated embodiment, and as alluded to previously herein, the MFC core is manufactured from a magnetically permeable material. The presence of a magnetically permeable core allows the miniature arc fault current sensor to be much smaller than an air coil with comparable sensitivity. The reduction in size is significant, thereby allowing the miniature arc fault current sensor to be utilized in conjunction with many commonly implemented printed circuit board (PCB) designs, and hence, enabling its use in a variety of devices which incorporate PCBs.

The output of the sense coil winding 106 of the miniature arc fault current sensor 102 is a voltage proportional to the time changing magnetic field that traverses the MFC 108 according to Faraday's Law. More specifically, the output voltage of sensor 102 is approximately equal to the rate change of flux that enters and exits the flanges (110 and 112) times a number of turns of the sense coil winding 106. This is because the magnetic flux concentrator 108 redirects magnetic field lines such that nearly all the magnetic flux entering a flange (110 or 112) will be routed through the center post 114.

For example, a miniature arc fault current sensor such as that shown with respect to FIG. 1A with lateral flange dimensions of 7 mm (millimeters)×7 mm with a round center post 4 mm in diameter wound with 250 turns of #38 gauge copper wire, has been shown to generate 250 uV (microvolts) RMS of output per Ampere of 50 Hz sinusoidal current in an adjacent current carrying conductor. Contrast this with a current sensor design that utilizes an air coil. In such a design, the sense coil winding would need to be 10 mm in diameter with three-hundred and fifty (350) turns in order to generate 250 uV RMS of output per ampere of 50 Hz sinusoidal current, requiring considerable more footprint area, copper wire, and time to produce. The additional PCB footprint area, turns (wire length), and winding time each contribute to a higher cost part than the smaller miniature arc fault current sensor constructed on a magnetic flux collector core as described herein.

The output of the miniature arc fault current sensor is also proportional to the frequency or the rate of change of the current in the conductor. For example, in embodiments utilized for higher frequency currents (i.e., greater than 1 KHz), the size and/or the number of turns on the MFC can be reduced proportionally as discussed in the Device Parameters section in the present disclosure.

While primarily discussed in the context of its incorporation onto PCBs, it is recognized that the present disclosure is not so limited, and can be implemented in a variety of ways so long as the miniature arc fault current sensor can be placed in close proximity/adjacent to a current carrying conductor such as a printed wiring board (PWB) trace or a current carrying bus bar. For example, in alternative arrangements (not shown), it is appreciated that the current sensor could be packaged into a housing specifically configured for clamping directly onto a current carrying bus bar. Moreover, as the shape/size of the current carrying conductor could conceivably vary, an integral housing with clamp can be specifically sized so as to mate with respective current carrying conductor variants.

Figure 1B:
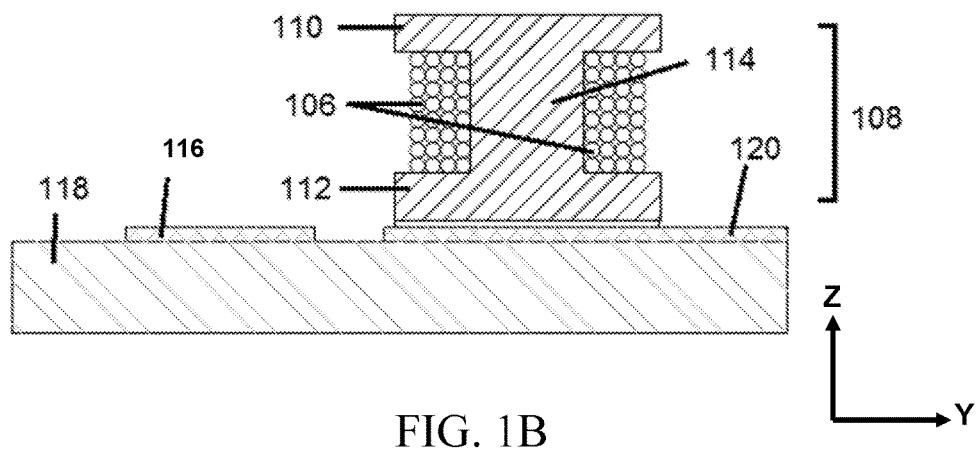
FIG. 1B is a cross-sectional view of the miniature arc fault current sensor of FIG. 1A taken along line B-B.

Referring now to FIG. 1B (in which the housing 104 has been removed from view for the purposes of clarity), MFC 108 includes an upper flange 110, a lower flange 112, and a center post 114 therebetween. Thus, upper flange 110, center post 114, and lower flange 112 are arranged along the vertical Z-axis. Center post 114 acts as a bobbin around which the sense coil winding 106 is wrapped. As shown in FIG. 1B, the MFC 108 varies in lateral cross-sectional area from a relatively large area at the upper and lower flanges to a relatively smaller cross-sectional area at the center post. Sense coil winding 106 is wound around center post 114 of the MFC between the upper and lower flanges. One advantage of such a configuration is that sense coil winding can be wound over itself, while being physically bound by the upper and lower flanges thereby enabling the use of a smaller sense coil winding with a larger number of turns (as compared with an air coil current sensor) without the use of a separate bobbin component made from, for example, an injection-molded polymer. In referring to cross sectional areas of the flanges 110 and 112 as well as the center post, it is to be understood that these areas are measured parallel to the lateral XY plane which is perpendicular to the Z-axis along which they are arranged.

Figure 1C:
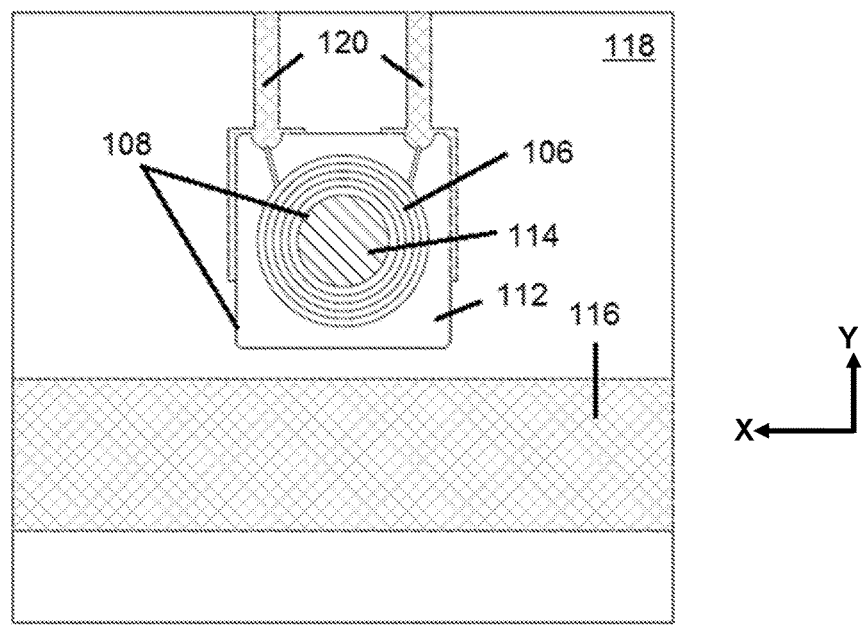
FIG. 1C is a cross-sectional view of the miniature arc fault current sensor of FIG. 1A taken along line C-C.

Referring now to FIG. 1C, the miniature arc fault current sensor illustrated in FIG. 1A is shown in a lateral cross-section illustrating the center post 114, sense coil winding 106 as well as the lower flange 112 mounted on PCB 118 disposed adjacent the current carrying conductor 116. The upper flange and housing have been hidden from view for purposes of clarity. FIG. 1C shows the ends of sense coil winding 106 attached to PCB traces 120 that connect the sensor to the detector circuitry. The method of attachment between sense coil winding 106 and the PCB traces is preferably a low electrical resistance connection that has a mechanical strength needed for the application. In one embodiment, the sensor 102 is mounted to a PCB 118 by soldering terminals of sense coil winding 106 to PCB 118 traces. The terminals of sense coil winding 106 would be proximate to lower flange 112 whereby lower flange is thereby mounted proximate to an upper surface of PCB 118.

Figure 2A:
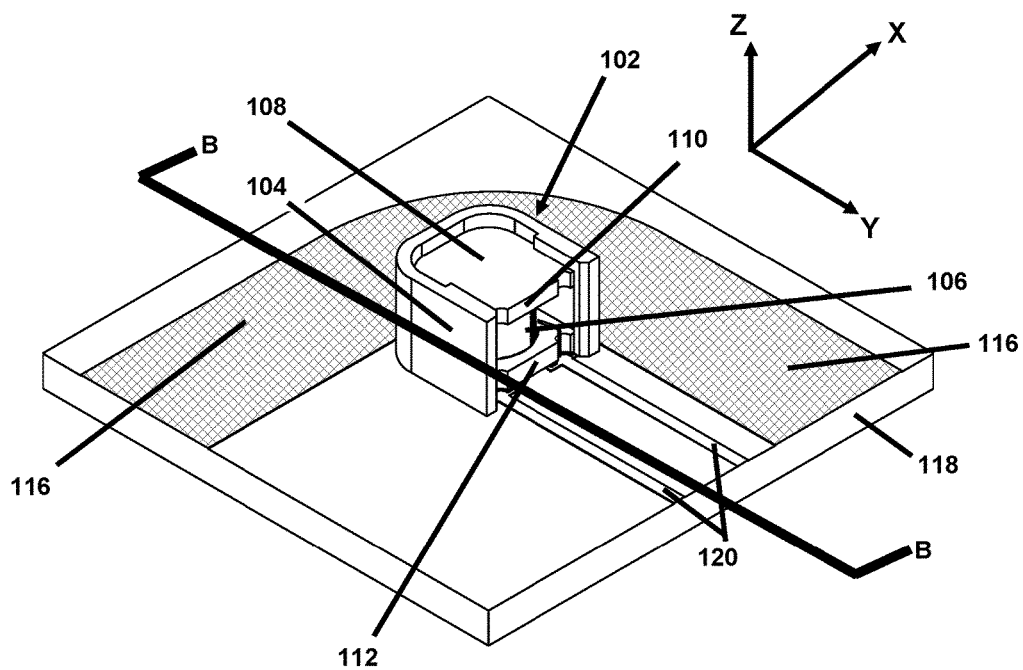
FIG. 2A is a perspective view of a second exemplary embodiment of a miniature arc fault current sensor positioned proximate to an arc fault current-carrying "L" shaped conductor in accordance with the principles of the present disclosure.
Figure 2B:
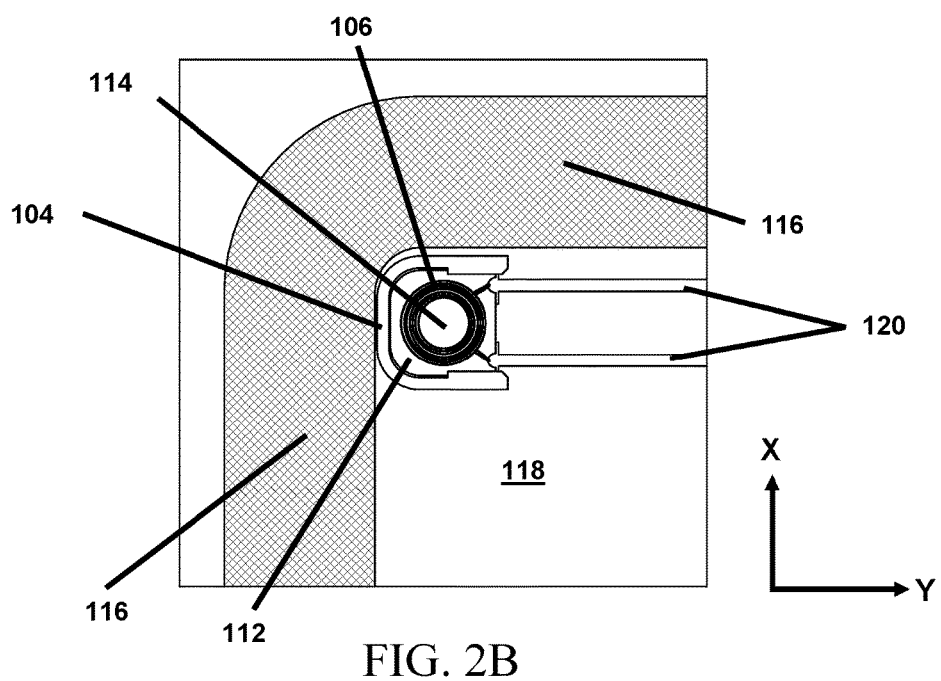
FIG. 2B is a cross-sectional view of the miniature arc fault current sensor of FIG. 2A taken along line B-B

In FIGS. 2A and 2B, an alternative arrangement for the miniature arc fault current sensor 102 mounted on a PCB 118 is shown and described in detail. Similar to the embodiment described above with respect to FIGS. 1A-1C, the current sensor includes a sense coil winding 106 wound about the center of MFC 108. The miniature arc fault current sensor is disposed adjacent to a current carrying conductor 116 located on a surface of the PCB. However, unlike the embodiment illustrated in FIGS. 1A-1C, current carrying conductor 116 has an "L"-shaped profile in the XY plane, thereby enabling the current sensor to be disposed adjacent to current carrying conductor on two (2) separate sides of flange 110. While the current carrying conductor is illustrated as being resident on an upper surface of the PCB (i.e., the surface to which the current sensor is mounted), it is appreciated that in alternative embodiments, the current carrying conductor could also be resident within the PCB or alternatively on the bottom surface of the PCB (i.e., the opposite surface to which the current sensor is mounted).

As described previously herein, the magnetic field generated by current passing through conductor 116 is strongest at points proximate to the conductor, with the strength of the magnetic field being approximately inversely proportional to the distance from the conductor. Thus, with respect to the placement of the MFC 108, lower flange 112 is preferably placed as close to the current-carrying conductor 116 as possible. For example, assuming current carrying conductor 116 carries current in a generally clockwise direction, current carrying conductor will thereby generate a magnetic field that generally circulates about conductor 116 according to the so-called "right-hand rule". The circulation of the magnetic field can be described as being directed along closed contours of equal field strength that are approximately axially centered upon the conductor. From the perspective of FIG. 2A, the magnetic field is directed clockwise around conductor 116 and through MFC 108. The presence of MFC 108 will focus the field lines as the magnetic field will be drawn into the magnetically permeable material because of its low-reluctance. The fact that the flanges of the MFC 108 are placed in close proximity to the conductor assures that a maximum amount of the magnetic flux will enter the MFC via the upper flange 110. Between the upper and lower flanges, the flux is concentrated and passes through center post 114 of MFC 108, thereby providing a maximized magnetic field strength through sense coil winding 106.

Referring now to FIG. 2B, the current sensor illustrated in FIG. 2A is shown in cross-section illustrating the center post 114, sense coil winding 106 as well as the lower flange 112 mounted on PCB 118, whereby the current sensor is disposed adjacent to the current carrying conductor 116. The upper flange and housing have been hidden from view for purposes of clarity. In the illustrated embodiment, MFC 108 is shown with generally rectangular flanges (similar to the embodiment shown with respect to FIG. 1C); however, the corners of the flange proximate to the L-shaped current carrying conductor contain radii such that the curves contained on L-shaped conductor 116 are concentric with the radii located on lower (and upper) flanges with the center post being generally cylindrical. Similar to that described with respect to FIG. 1C, sense coil winding 106 is wrapped around center post 114 and terminated to respective conductive traces 120.

The output of the miniature arc fault current sensor 102 in the configuration shown in FIGS. 2A and 2B will be greater than the output of the miniature arc fault current sensor 102 shown in FIGS. 1A, 1B, and 1C because the additional length of the current carrying conductor 116 adjacent to flange 112 contributes additional flux proportional to the ratio of the length of the current carrying conductor 116 adjacent to the flange. In the case of square flanges 110 and 112 in FIGS. 2A and 2B, the additional flux collected would be approximately two times (2×) that of FIGS. 1A and 1B. This would translate into a miniature arc fault current sensor output two times (2×) that of FIGS. 1A and 1B.

Figure 3A:
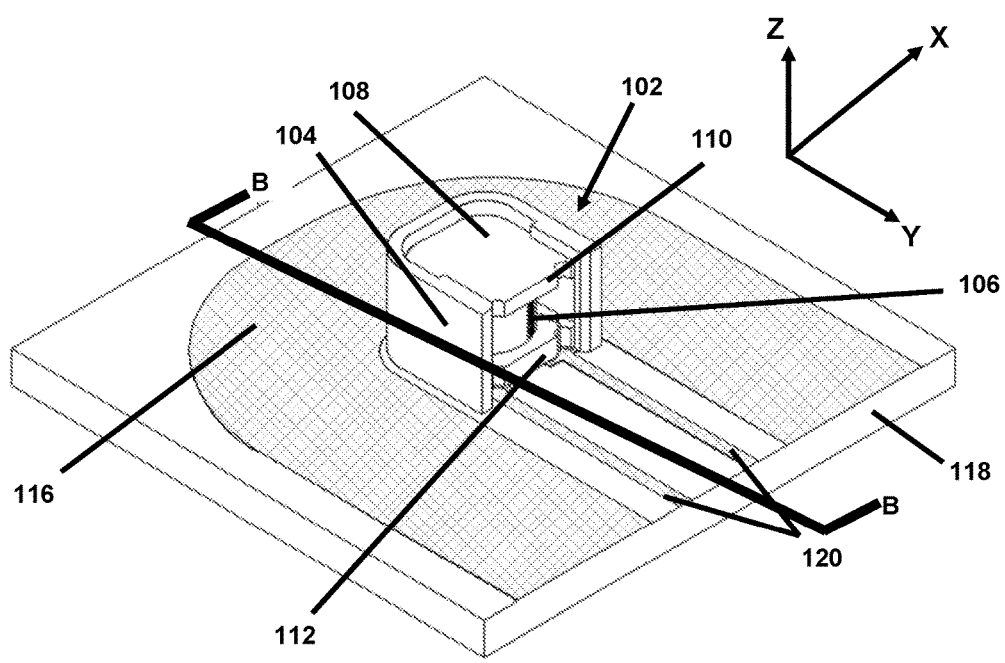
FIG. 3A is a perspective view of a third exemplary embodiment of a miniature arc fault current sensor positioned proximate to an arc fault current-carrying "U" shaped conductor in accordance with the principles of the present disclosure.
Figure 3B:
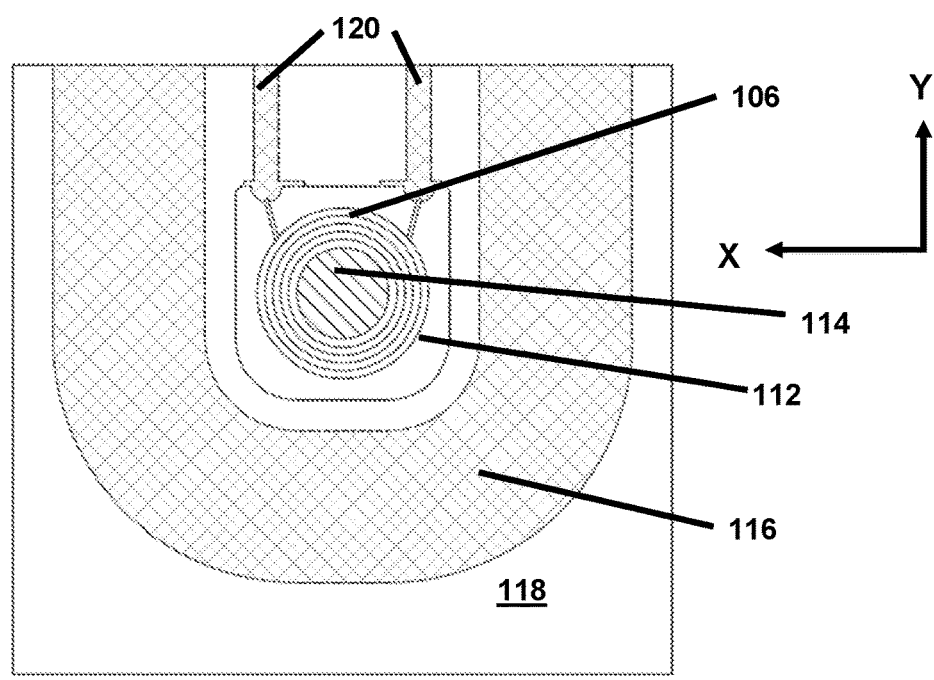
FIG. 3B is a cross-sectional view of the miniature arc fault current sensor of FIG. 3A taken along line B-B

Referring now to FIGS. 3A and 3B, an alternative arrangement for a current sensor 102 is illustrated disposed next to a U-shaped current carrying conductor 116. The alternative arrangement shown illustrates an embodiment where the edge of flange 112 is disposed proximate to, and follows along with, the edge of the current carrying conductor. The output of the miniature arc fault current sensor 102 in the configuration shown in FIGS. 3A and 3B will be greater than the output of the miniature arc fault current sensor 102 shown in FIGS. 1A, 1B, and 1C because the additional length of the current carrying conductor 116 adjacent to flange 112 contributes additional flux proportional to the ratio of the length of the current carrying conductor 116 adjacent to the flange. In the case of square flanges 110 and 112 in FIGS. 3A and 3B, the additional flux collected would be approximately three times (3×) that of FIGS. 1A and 1B. This would translate into a miniature arc fault current sensor output three times (3×) that of FIGS. 1A and 1B.

Figure 4A:
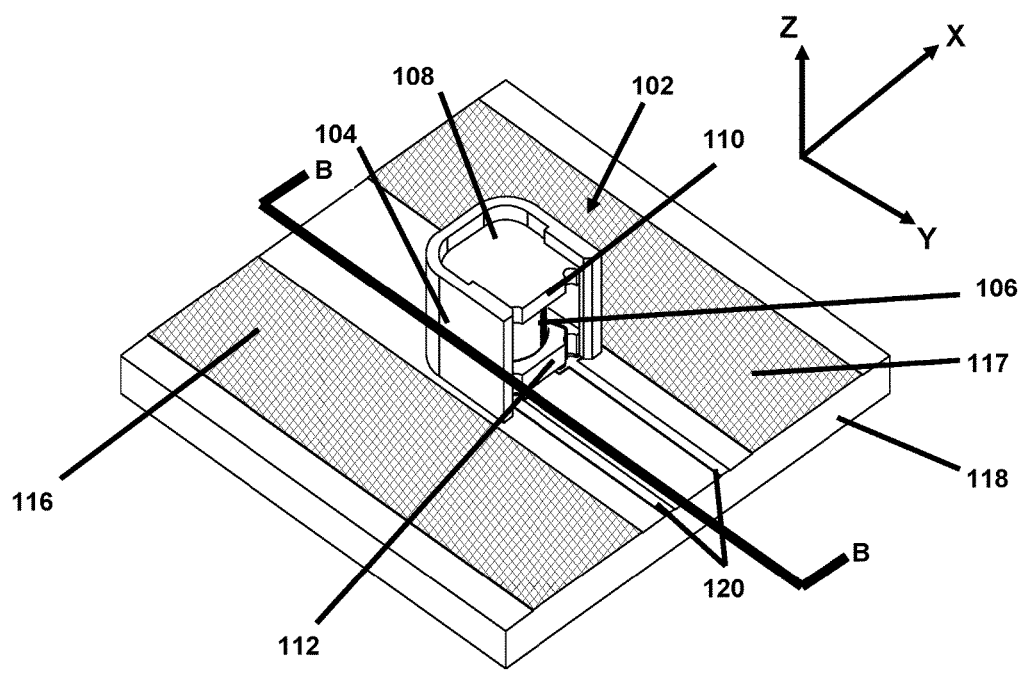
FIG. 4A is a perspective view of a fourth exemplary embodiment of a miniature arc fault current sensor positioned proximate to two arc fault current-carrying conductors in accordance with the principles of the present disclosure.
Figure 4B:
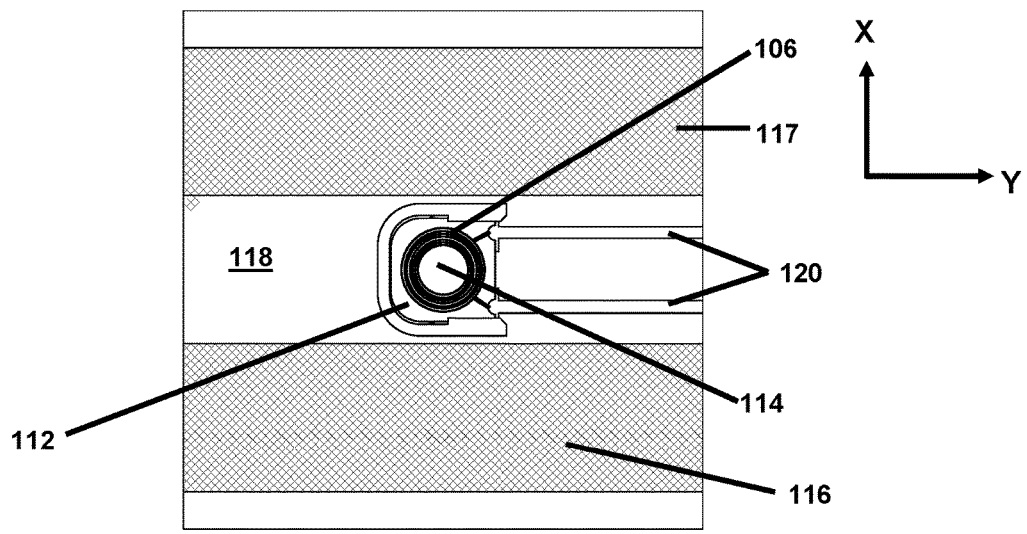
FIG. 4B is a cross-sectional view of the miniature arc fault current sensor of FIG. 4A taken along line B-B

Referring now to FIGS. 4A and 4B, an alternative arrangement for a current sensor 102 is illustrated disposed next to parallel current carrying conductors 116 and 117 in which equal currents flow in opposite directions. The alternative arrangement shown illustrates an embodiment where the edge of flange 112 is disposed proximate to, and follows along with, the edges of the current carrying conductors 116 and 117. The output of the miniature arc fault current sensor 102 in the configuration shown in FIGS. 4A and 4B will be greater than the output of the miniature arc fault current sensor 102 shown in FIGS. 1A, 1B, and 1C because the additional length of the current carrying conductors 116 and 117 adjacent to flange 112 contributes additional flux proportional to the ratio of the lengths of the current carrying conductor 116 plus 117 adjacent to the flange. In the case of square flanges 110 and 112 in FIGS. 4A and 4B, the additional flux collected would be approximately two times (2×) that of FIGS. 1A and 1B. This would translate into a miniature arc fault current sensor output two times (2×) that of FIGS. 1A and 1B. In addition, this arrangement is useful to reject common mode currents (i.e., current flowing in the same direction in both traces 116 and 117). When identical current flows in the same direction in both traces, the magnetic fields are equal and opposite, effectively cancelling each other and not resulting in any output from the sensor.

Figure 5:
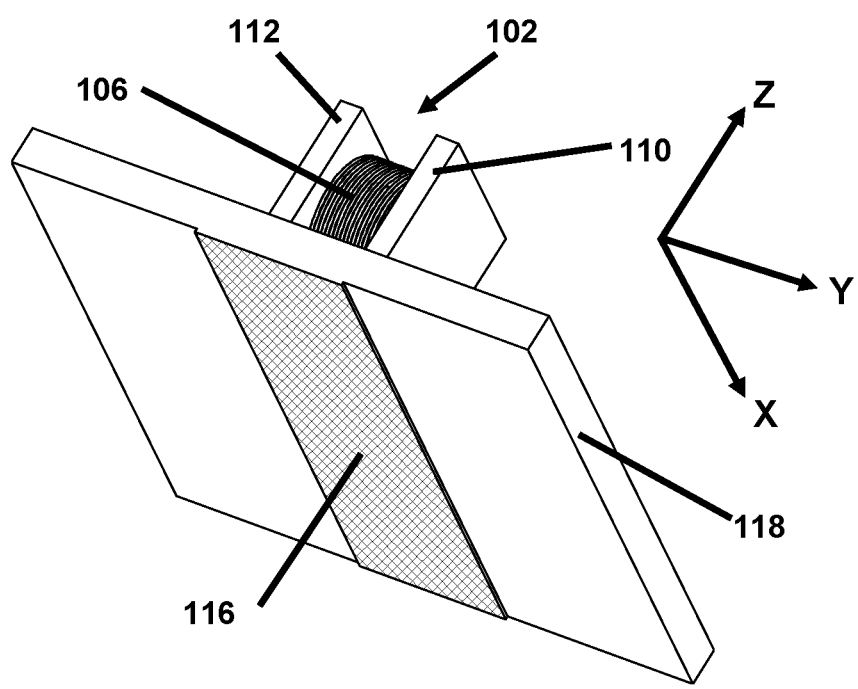
FIG. 5 is a perspective view of a variant application of the miniature arc fault current sensor of FIGS. 1A-1C whereby the sensor 102 is positioned with the axis of the MFC and the sense coil winding disposed parallel to the PCB and on the top side of the PCB above the current carrying conductor trace which is on the bottom side of PCB in accordance with the principles of the present disclosure.

Referring now to FIG. 5, an alternate variant for the current carrying conductor whereby the conductor is on the bottom side of PCB 118 and the miniature arc fault current sensor 102 is on the top of the PCB. To maximize the output of the current sensor, it is rotated 90 degrees counterclockwise from the orientation typically shown in FIGS. 1, 2, 3, and 4 to allow the magnetic flux lines to be collected by the MFC 108 as they are in FIGS. 1, 2, 3, and 4. For a current in the +X direction, the flux lines follow the "right hand rule" and rotate clockwise about the current carrying conductor 116. For all other parameters being equal, the output of the miniature arc fault current sensor 102 would be approximately the same as that shown in FIG. 1A. In this configuration, the PCB 118 provides additional electrical isolation between the current carrying conductor 116 and the current sensor 102.

Figure 6:
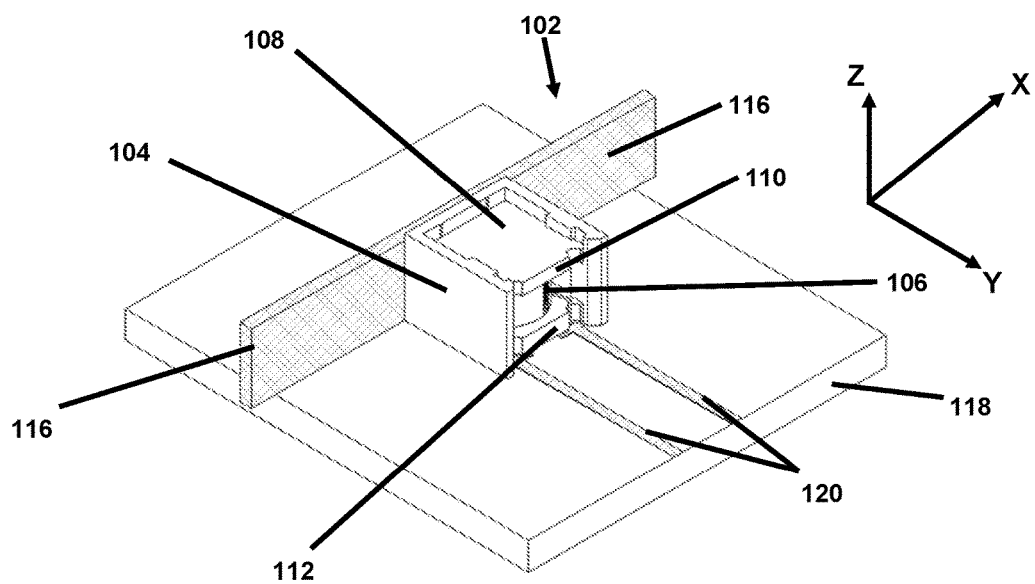
FIG. 6 is a perspective view of a variant application of the miniature arc fault current sensor of FIGS. 1A-1C positioned proximate to a vertically disposed current-carrying conductor (such as a buss bar) in accordance with the principles of the present disclosure.

Referring now to FIG. 6, an alternate variant for the current carrying conductor 116 for use with the current sensor 102 of FIGS. 1A-1C is illustrated. In the illustrated embodiment, the current carrying conductor 116 is flipped orthogonal to the embodiment illustrated in, for example, FIG. 1A. This configuration is representative of, for example, the UL 1699 requirement for AFCI in circuit breakers and AC receptacles (plug-ins) to sustain a 20-50 uSec current spike of 2000 A. PCB traces would melt and open like a fuse so they must be replaced with a metal buss bar of sufficient size so that it does not melt or fuse during the current spike test.

While not shown in FIG. 6, the current carrying conductor 116 could be shaped L-shaped or U-shaped to increase the output of the miniature arc fault current sensor similar to the approach described above for FIGS. 2A/B, 3A/B, and 4A/B. It should be noted that this approach to rotating the current carrying conductor reduces the amount of circuit board area needed for the conductor, particularly if the conductor must support a large AC or DC current in addition to the arc fault current. This is an example of the flexibility of the miniature arc fault current sensor.

Figure 7:
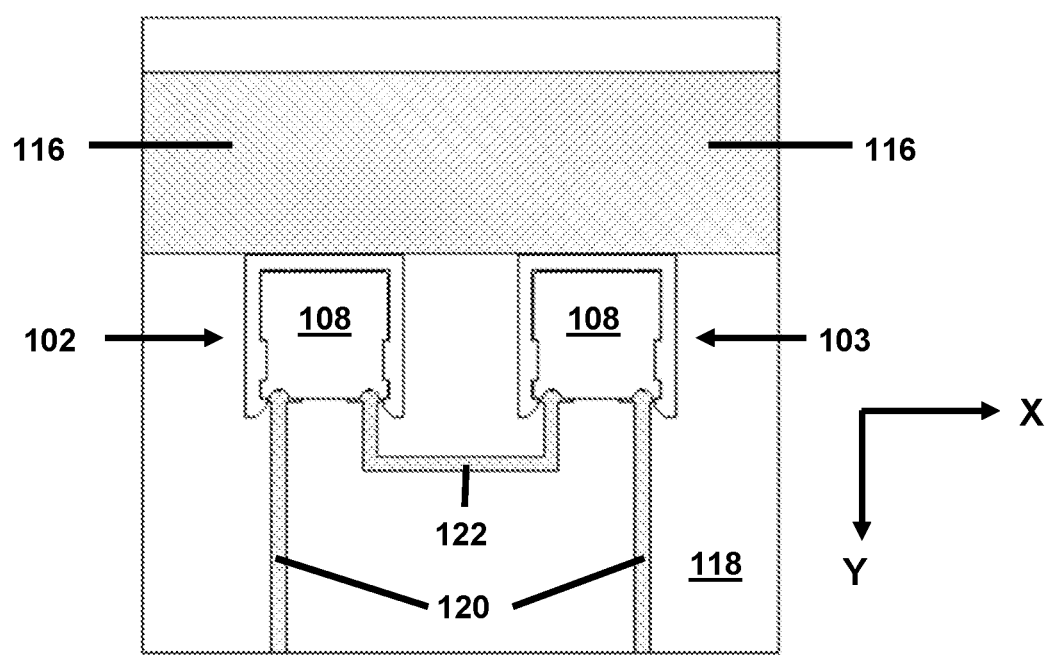
FIG. 7 is a top plan view of a pair of miniature arc fault current sensors positioned in series in accordance with the principles of the present disclosure.

Referring now to FIG. 7, yet another variant is shown in which multiple current sensors 102 and 103 are connected in series via output traces 120, 122. As illustrated, the current sensors are each disposed adjacent to each other, as well as adjacent to the current carrying conductor 116. Such a configuration enables the generation of a larger signal output approximately to the output of a single sensor multiplied by the number of sensors connected in series, as compared with designs utilizing only a single current sensor. Applications for this variant would be found in situations where a higher output was needed and the current carrying conductor could not be shaped in the L or U shapes described previously.

Moreover, while the series configuration illustrated includes two (2) current sensors, it is appreciated that more current sensors (i.e., three (3) or more) could readily be adopted in applications where higher output is needed.

While the embodiment shown illustrates the current sensors as being disposed adjacent to the current carrying conductor 116, it is appreciated that variants are readily envisioned in which the series coupled current sensors are disposed on opposite sides of the current carrying conductor properly connected to ensure the outputs are additive. Such a configuration would tend to reduce the effect by cancellation a large AC magnetic field directed approximately perpendicular to the PCB across the area of the sensors.

Device Parameters—

Six major parameters affect the output of the miniature arc fault current sensor 102: (1) flange (110 and 112) shape and size; (2) sense coil winding turns; (3) MFC 108 material; (4)

current frequency/rate of change; (5) mounting orientation of the sensor; and (6) location of the sensor from the current carrying conductor. In discussing the parameters, directions with respect to FIGS. 1A-C will be used. The XY plane is equated with an upper surface of a PCB 118 upon which the sensor 102 is mounted. The Z-axis is perpendicular to the PCB 118 upper surface. The X and Y axes extend along "lateral" directions and the Z-axis extends along a "vertical" direction. It is to be understood that terms lateral and vertical do not refer to a gravitational reference but to directions relative to the upper surface of the PCB.

Flange Shape—

In some embodiments, a preferred flange shape is an optimization between the best magnetic field concentration performance (as measured by sensor output voltage) and the difficulty of winding the sense coil winding 106 onto the MFC 108.

Experimentation and theoretical analysis show that the optimum is for both flanges (110 and 112) to be the same shape, size, and orientation relative to the center post 114 between the flanges. If one flange (110 or 112) is smaller than the other or not oriented parallel and concentric to the other flange, it will reduce the MFC 108 reluctance, magnetic field concentration, and thereby the output voltage of the sensor 102. The output of the sensor 102 will be approximately that which would be obtained if the larger flange were reduced to the size and orientation of the smaller flange.

Considering various economical MFC flange shapes— i.e., square, rectangular (3 long×1 wide for example), oval, circular, and mixed shapes—the square shape is preferred for an exemplary embodiment. For each of three particular shapes with the same flange area placed immediately adjacent to a current carrying conductor (for example a trace on a PCB), a "three by one" rectangle (long axis parallel to trace along X-axis and being three times the dimension along the X-axis) will have the highest flux collection, a square will be next at 91% of the three by one rectangle, and a circular shape will be last at 85% of the three by one rectangle. Winding the sense coil winding on the MFC is optimal with symmetrical flange shapes of square and circle and most difficult for the rectangle shaped flanges. Hence in an exemplary embodiment, the square shaped flange is found to be an optimal design factoring in manufacturing efficiency and magnetic flux capture.

The output of the current sensor increases as the lateral cross sectional area of the flanges increase (all other parameters being equal) for any given shape. However, as the lateral area exceeds 1 square centimeter, the sensor becomes too large for applications on small PCBs such as those used in compact arc fault detector applications. For exemplary small PCBs, the largest practical size for the sensor fits within a cube that has a 10 millimeter edge. In another exemplary embodiment, the current sensor fits within a cube having an edge dimension of less than 9 millimeters. In yet another exemplary embodiment, the current sensor fits within a cube having an edge dimension of less than 8 millimeters. In still another embodiment, the current sensor has flanges that each defines a lateral area that is approximately 40-60 square millimeters. It is to be understood that the present disclosure can be applicable to some applications that allow sensors that are larger and cannot be fit within a cube having a 10 millimeter edge dimension.

The MFC center post 114 provides several functions: (1) it provides a "bobbin" about which the sense coil winding 106 is wound; (2) it provides a low reluctance path between the two flanges (110 and 112) for a magnetic field; and (3) it provides mechanical support of the two flanges (110 and 112) with respect to each other. The lateral cross sectional area of the center post 114 is less than that of the flanges (110 and 112) in order to provide space for the sense coil winding 106. For high sensitivity applications, the MFC 108 material does not get close to saturation, allowing for the use of a center post 114 having a cross sectional area much smaller than that of the flanges (110 and 112). In one embodiment, the lateral cross sectional area of the flanges (110 and 112) are each at least two times that of the center post 114. In another embodiment, the lateral cross sectional area of the flanges (110 and 112) are each at least three times that of the center post 114. In yet another embodiment, the lateral cross sectional area of the flanges (110 and 112) are each at least three times that of the center post 114. In an exemplary embodiment, the flanges (110 and 112) each have a lateral cross-sectional area in a range of 40 to 60 square millimeters and the center post 114 has a cross-sectional area in a range of 10 to 30 square millimeters. These geometries of the MFC flanges (110 and 112) and center post 114 enable a very sensitive arc fault sensor 102 having a very small dimension suitable for a small PCB 118 application.

In the illustrative embodiment of FIG. 1A-C the center post 114 is circular and roughly centered upon flanges 110 and 112 relative to the XY plane. In alternative embodiments, center post 114 can take on other shapes such as a square, a triangle, or a square with rounded corners, to name a few examples. In other alternative embodiments, the center post 114 may not be centered relative to flanges 110 and 112. In still other embodiments, the flanges 110 and 112 can have other shapes such as rectangular, partially oval, or triangular to name some examples.

Sense Coil Winding—

Voltage output of the miniature arc fault current sensor 102 is proportional to the number of turns in the sense coil winding 106 (all other parameters being equal) per Faraday's law. The practical limits to the number of turns are one turn for the lower limit as it is difficult to affix and connect a partial turn and the number of turns that will fit securely between the flanges as the upper limit. Wire diameter (gauge) is not a parameter of concern except for allowing more or less turns on a given MFC because sense coil winding current is quite small (micro Amperes) as this is a high impedance device and the output voltage is sensed by a high impedance circuit.

In a first embodiment, the sense coil winding 106 has at least 50 turns. In a second embodiment, the sense coil winding 106 has at least 100 turns. In a third embodiment, the sense coil winding 106 has at least 150 turns. In a fourth embodiment, the sense coil winding 106 has at least 200 turns. In an exemplary embodiment, the sense coil winding 106 has about 250 turns. In other embodiments, the sense coil winding 106 can have even more turns by choosing a smaller gauge wire and by increasing the ratio of the flange (110 or 112) area to the center post 114 area.

MFC Material—

This a dimensionless parameter that is the relative permeability ($\mu_r$) of the soft magnetic material of the MFC compared to that of free space. Values of $\mu_r$ range from approximately one (1.0) for non magnetic materials (wood, plastic, aluminum) and from 1000 to 10,000+ for soft ferrites. The output of the miniature arc fault current sensor is proportional to $\mu_r$, all other parameters being equal. Simulations for an exemplary embodiment show that $\mu_r$ values >100 are sufficient to achieve the desired magnetic field concentration effect. Relative permeability ($\mu_r$) values much greater than 100 such as 5,000 to 10,000 do not provide significantly greater outputs than values closer to 100 and usually cost more than the lower permeability materials. Other embodiments may require $\mu_r$ values of much greater than 100.

Location—

This parameter is the distance from the edge of the lower flange 112 to the edge of the current carrying conductor 116. With all other parameters being equal, the output voltage of the miniature arc fault current sensor decreases as this distance increases. For distances from a linear trace extending in the X-direction greater than ten times the width of the flange in Y, the decrease in output voltage approaches the inverse square of the distance. The minimum distance is zero and the largest distance can be many times the width of the flange where the output decreases to a level that cannot be utilized by the arc fault detector electronics. Generally, the miniature arc fault current sensor will be placed as close to the current carrying conductor as isolation voltage requirements allow. It should be noted as discussed earlier that for all but one orientation, the flange preferably does not overlap the edge of the current carrying conductor.

In a first exemplary embodiment, the distance from an edge of lower flange 112 to current carrying trace 116 is less than four millimeters. In a second exemplary embodiment, the distance from an edge of lower flange 112 to current carrying trace 116 is less than three millimeters. In a third exemplary embodiment, the distance from an edge of lower flange 112 to current carrying trace 116 is less than two millimeters. In a fourth exemplary embodiment, the distance from an edge of lower flange 112 to current carrying trace 116 is less than one millimeter. In a fifth exemplary embodiment, an edge of lower flange 112 is proximate to trace 116 with a minimized gap there between.

Mounting of Sensor—

Sensor 102 is mounted to the upper surface of PCB 118 using one of a number of techniques. In an exemplary embodiment, the housing 104 is mounted to the upper surface of the PCB 118 and is disposed between the PCB 118 and the lower flange 112. In an alternative embodiment, sensor 102 has no outer housing 104 and the lower flange is mounted directly to the upper surface of PCB 118. In an exemplary embodiment, the soldering of terminals of sense coil winding 106 to traces 120 provides a structural mounting bond between sensor 102 and the upper surface of PCB 118. In other alternative embodiments an adhesive such as an epoxy can be used to mount either lower flange 112 or housing 104 to the upper surface of PCB 118. The epoxy may be a flexible epoxy to minimize component stress and to maximize impact strength.

Frequency—

This parameter is the frequency or frequency content of the arc fault current in the current carrying conductor. For single frequencies, the output of the miniature arc fault current sensor increases linearly with frequency, all other parameters being equal. The output of the sensor is the sum of all single frequency currents combined in the broadband arc fault current. These frequencies range from 1 KHz to 1 GHz as discussed earlier in this disclosure.

Other Current Sensing Applications—

The exemplary current sensing apparatus described herein are relatively simple and economical to manufacture. In addition, the current sensing apparatus described herein are electrically isolated from the conductors that they are intended to sense (such as via e.g., a non-conductive polymer housing). In exemplary embodiments, the current sensing apparatus is useful for sensing broadband electrical currents ranging in frequency from 1 KHz to upwards of 1 GHz. Potential additional (beyond arc fault current sensing) applications for such current sensing apparatus include, but are not limited to, electric motors that use approximately sixty percent (60%) of the electrical energy consumed in an industrial environment.

One such application for the current sensing apparatus described herein is for the protection of an electric motor from destruction due to current overloads. Various examples where protecting an electric motor from destruction due to current overloads includes, without limitation: conveyor jams (whether via internal mechanical failures or via interference from external objects); crusher/shredder/grinder overloads (e.g., when the material being crushed/shredded/ground is larger than the design limitations of the particular machine); saw overloads; and pump jams.

An alternative application for the current sensing apparatus described herein includes the identification of internal insulation destruction or other electrical equipment failures (via the sensing of electric current increases) to allow for, inter alia, preventative maintenance. Various examples of these applications include the identification of failing motor bearings; deteriorating motor winding insulation; deteriorating transformer winding insulation due to increases in current and/or a partial discharge of high frequency AC current; electric heater element partial failures; deteriorating electric heater element insulation; deteriorating light lamps; and deteriorating ultraviolet and infrared processing lamps, etc.

Moreover, good engineering practice suggests that every control output should have a corresponding status input for verification and for controlling various processes by sensing the electrical loads via the current being consumed and adjusting the mechanism in order to create more common electrical loading. Accordingly, the current sensing apparatus described herein could be utilized to ensure that an AC induction motor current is proportional to the load. For example, sensing the current and adjusting the operation of the mechanism responsible for increased loading can be utilized for pumps, saws, conveyers, grinders, shredders, drills, etc. Electric welding weld quality is also proportional to the amount of current consumed. Accordingly, by sensing the current and adjusting the wire feed and tip movement, the current sensing apparatus described herein could find utility in electric welding equipment as well. Moreover, AC generator and transformer load monitoring and load shedding could also be monitored with the current sensing apparatus described herein so as to prevent, for example, current overloads. Power factor detection based on current versus voltage phase comparison can also be monitored by the current sensing apparatus described herein, and corrective action can be taken via any number of differing methodologies.

Finally, the current sensing apparatus described herein can be utilized for failure alarming to generate any number of corrective actions. For example, critical lighting infrastructure (such as for use on an airport runway) can more reliably be monitored based on lamp current measurements as opposed to being monitored by photo detectors which can become dirty, fogged, etc. Critical AC electrical heating element failures in, for example chemical and industrial processes, can be detected quicker and more reliably by monitoring heater current, as opposed to using thermal sensors. Arc fault sensing of electrical conductors to detect critical insulation failures in low voltage AC distribution equipment for use in photovoltaic systems can benefit from the current sensing apparatus described herein. Partial discharge detection can also be monitored using the current sensing apparatus described herein.

Accordingly, while a number of specific applications has been described above, it is readily appreciated that the current sensing apparatus described herein has broader utility by utilizing a simple, economical, broadband AC current sensor with an electrical output voltage that is proportional to the AC current magnitude (e.g., in amperes) and frequency content of the sensed AC current.

While the above detailed description has shown, described, and pointed out novel features of the disclosure as applied to various embodiments, it will be understood that various omissions, substitutions, and changes in the form and details of the device or process illustrated may be made by those skilled in the art without departing from the disclosure. The foregoing description is of the best mode presently contemplated of carrying out the disclosure. This description is in no way meant to be limiting, but rather should be taken as illustrative of the general principles of the disclosure. The scope of the disclosure should be determined with reference to the claims.

What is claimed is:

1. A compact arc fault sensor for sensing a varying current in a current carrying conductor on a circuit board having an upper surface that supports the current carrying conductor, the varying current creating a varying magnetic field that circulates around the current carrying conductor, the compact arc fault sensor comprising:
   a magnetic flux concentrator having a lower flange, an upper flange, and a center post disposed between the upper flange and the lower flange, the lower flange for mounting proximate to the upper surface of the circuit board whereby the lower flange defines an edge that is proximate to an edge of the current carrying conductor carrying the varying current to be measured, the lower flange and the upper flange each having a larger lateral cross-sectional area than a lateral cross-sectional area of the center post as measured along a plane that is parallel to a portion of the upper surface whereby the circulating magnetic field passes through the upper and lower flanges and is concentrated along the center post; and
   a sense coil wound around the center post and having terminals that provide an output voltage that is proportional to the rate of change of the current in the current carrying conductor to allow a very compact sense coil winding to output a voltage that is substantially enhanced by the ratio of the cross-sectional areas of the flanges relative to the cross sectional area of the center post.

2. The sensor of claim 1, wherein the lower flange is configured for mounting directly to the upper surface of the circuit board.

3. The sensor of claim 1, wherein the sensor includes an outer housing that surrounds at least a portion of the magnetic flux concentrator.

4. The sensor of claim 3, wherein the housing includes a housing portion between the lower flange and the upper surface of the circuit board.

5. The sensor of claim 3, wherein the housing includes a middle portion that is disposed between the upper and lower flanges wherein at least a portion of the sense coil winding is between the middle portion of the housing and the center post.

6. The sensor of claim 1, wherein the sense coil winding includes two terminals for soldering to the upper surface of the circuit board.

7. A compact sensor for sensing a varying current in a current carrying conductor formed upon a circuit board, the circuit board having an upper surface defining an XY plane, the sensor comprising:
   a magnetic flux concentrator having a lower flange, an upper flange, and a center post between the upper flange and the lower flange, the lower flange for mounting proximate to the upper surface of the circuit board whereby the lower flange defines an edge that is proximate to an edge of the trace, the magnetic flux concentrator extending along a Z-axis that is normal to the XY plane, the lower flange, the center post, and the upper flange arranged along the Z-axis and each defining a projected lateral area relative to the XY plane, the projected lateral area of each of the lower flange and the upper flange are greater than the projected lateral area of the center post whereby a magnetic flux passing through the upper and lower flanges is concentrated in the center post; and
   a sense coil wound around the center post and configured to provide a voltage output proportional to a rate change of magnetic flux passing through the center post which is enhanced by the magnetic flux concentrator.

8. The sensor of claim 7, wherein the lower flange is configured for mounting directly to the upper surface of the circuit board.

9. The sensor of claim 7, wherein the sensor includes an outer housing that surrounds at least a portion of the magnetic flux concentrator, the outer housing includes a housing portion between the lower flange and the upper surface of the circuit board.

10. The sensor of claim 7, wherein outer dimensions of the sensor fit within a cube having outer dimensions of less than 10 millimeters along the X, Y, and Z axes.

11. The sensor of claim 7, wherein a magnetic flux field strength passing through the center post is at least double that of the flanges in order to enable a very compact arc fault sensor.

12. The sensor of claim 7, wherein the projected area of the upper flange and the lower flange are each at least two times the projected area of the center post of the magnetic flux concentrator.

13. The sensor of claim 7, wherein the projected area of the upper flange and the lower flange are each at least three times the projected area of the center post of the magnetic flux concentrator.

14. The sensor of claim 7, wherein the projected area of the upper flange and the lower flange are each at least four times the projected area of the center post of the magnetic flux concentrator.

15. A compact arc fault sensor system for sensing a varying current in a current carrying conductor on a circuit board, the varying current creating a varying magnetic field that circulates around the current carrying conductor, the system comprising:
   a compact arc fault sensor comprising:
      a magnetic flux concentrator formed from a material having a relative permeability of at least 100 having a center post between two flanges including a first flange and a second flange, the compact arc fault sensor configured to be mounted to the circuit board such that a flux from the circulating magnetic field enters the first flange, passes through center post, and exits through the second flange; and
      a sense coil winding disposed around the center post of the magnetic flux concentrator, the sense coil winding configured to output a voltage that is proportional to the rate of change of the varying current, the magnetic field strength is increased by the flux concentration between the two flanges to enable a compact sense coil winding to increase the output voltage for a given coil size;

wherein the current carrying conductor has a desired geometry with respect to the compact arc fault sensor.

16. The compact arc fault sensor system of claim 15, wherein the desired geometry comprises two portions of one or more circuit board traces that each run parallel with one another at least on a first and a second side of the compact arc fault sensor.

17. The compact arc fault sensor system of claim 16, wherein the desired geometry further comprises a third portion of the one or more circuit board traces that runs generally perpendicular to the two portions of the one or more circuit board traces.

* * * * *